Jan. 24, 1967 T. G. STEHNEY ET AL 3,300,694

SEMICONDUCTOR CONTROLLED RECTIFIER WITH FIRING PIN PORTION ON EMITTER

Filed Dec. 20, 1962

WITNESSES

Edwin E. Baesler

James F. Young

INVENTORS

Thomas G. Stehney &

Thorndike C. T. New

BY Gordon H. Telfer

ATTORNEY

United States Patent Office 3,300,694
Patented Jan. 24, 1967

3,300,694

SEMICONDUCTOR CONTROLLED RECTIFIER WITH FIRING PIN PORTION ON EMITTER

Thomas G. Stehney, Poughkeepsie, N.Y., and Thorndike C. T. New, Hempfield Township, Westmoreland County, Pa., assignors to Westinghouse Electric Corporation, Pittsburgh, Pa., a corporation of Pennsylvania Filed Dec. 20, 1962, Ser. No. 246,046
7 Claims. (Cl. 317—235)

The present invention relates generally to semiconductor switching devices and, more particularly, to four layer devices suitable for use as controlled rectifiers.

A semiconductor controlled rectifier is a device generally comprising four successive regions of alternate semiconductivity type matelial. The regions, in sequence, are herein referred to as the cathode-emitter (or cathode), the first base, the second base and the anode-emitter (or anode), respectively, for an NPN device. Terminals are provided on the cathode, anode and first base regions. A load circuit connected across the cathode and anode can be controllably energized by a control signal applied to the terminal on the first base region, which terminal is referred to as the gate.

Four layer switching devices, either NPNP, PNPN or those designated NPNM or PNPM, have a well known I–V characteristic in at least one quadrant including a low conductivity or high resistance portion and a portion of very low resistance and hyperconductivity with a transition region of negative resistance therebetween. A sufficient voltage applied across the anode and cathode can produce breakover, that is switching from the high resistance to the hyperconductive state, without the application of any control signal to the gate. This voltage is referred to as the breakover voltage of the device. It is generally desirable that the breakover voltage be relatively high so that the device does not switch merely due to the voltage across it applied by the load circuit. It is preferred that the device become conductive at most voltage levels only upon application of a signal to the gate.

Devices are now made including a diffused first base region with an alloyed cathode-emitter thereon. It is presently necessary in such devices that the diffused base region have a high impurity concentration where the fused junction is formed. The impurity concentration must be carefully controlled at a level below saturation to achieve a high breakover voltage without preventing switching altogether.

It is therefore an object of the present invention to provide an improved semiconductor switching device.

Another object is to provide an improved four layer semiconductor switching device wherein a high breakover voltage is achieved without the necessity of a carefully controlled surface concentration in the diffused base region.

Another object is to provide a semiconductor controlled rectifier having at least as high a breakover voltage as that achieved in present devices but capable of easier fabrication.

Another object is to provide improved methods of fabricating four layer semiconductor switches.

The invention, briefly, is directed to a semiconductor switching device of which one emitter region includes a portion, herein refered to as a firing pin portion, which penetrates into the adjacent base region a greater distance than does the major portion of the emitter so that the breakover or firing characteristic of the device is determined by the depth of penetration of the firing pin portion, which is readily controllable, and so that irregularities in the surface of the emitter junction and in the impurity concentration of the base region will not directly determine the breakover point.

The present invention, both as to is organization and manner of operation, together with the above mentioned and other objects and advantages thereof, may best be understood by reference to the following description, taken in connection with the accompanying drawings, in which.

Figure 1:
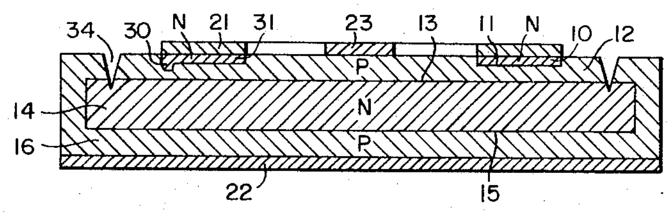
FIGURE 1 is a cross sectional view of a semiconductor controlled rectifier in accordance with this invention after fabrication is essentially complete except for connection of leads and encapsulation.

Referring to FIG. 1, there is shown a four region semiconductive device in which the alternate semiconductivity type regions will be designated as the cathode-emitter 10, the first base 12, the second base 14 and the anode-emitter 16 with PN junctions 11, 13 and 15 therebetween. Ohmic contacts 21, 22 and 23 are affixed to the cathode 10, anode 16 and first base 12, respectively.

In the example shown the emitter 10 is a recrystallized alloyed semiconductive region formed by fusion of a suitable alloy foil member to the semiconductive body and has an annular configuration surrounding the gate contact 23. The contact 21 to the emitter 10 is a result of the same fusion operation. The emitter 10 includes a firing pin portion 30 which penetrates within the first base region 12 to a depth greater than that of the major portion 31 of the emitter 10. In determining the breakover or firing characteristic of this device, only the depth of penetration of the firing pin portion 30 need be carefully controlled. The extent of penetration of the firing pin portion 30, which forms a very small part of the emitter junction 11, can be much more readily controlled than that of a large area region.

Furthermore, in conventional devices, a high impurity concentration in the first base region 12 at the emitter junction 11 is necessary in order to hold off the firing before reaching the junction avalanche point, thus achieving maximum breakover voltage. However, a maximum value of surface concentration exists which if exceeded will prevent the device from switching by a specified gate current. This is because the transistor gain, $\alpha$, is dependent on the injection efficiency and effective lifetime of the injected carriers near the junction region due to carrier recombination; the injection efficiency and lifetime in turn depend on the doping level.

According to the present invention, the first base region 12 may be and preferably is diffused to saturation. This value of surface concentration is far above the value permissible in the conventional device. The saturated value of surface concentration can be readily achieved without as precise care in the fabrication process since it is almost completely determined by the diffusion temperature.

Figure 2:
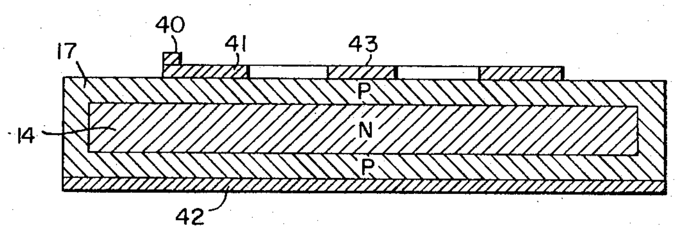
FIG. 2 is a cross sectional view of the device shown in FIG. 1 at an earlier stage of fabrication.

In FIG. 2 is shown the device of FIG. 1 before the fusion operation by which the rectifying emitter 10 and ohmic gate and anode contacts 23 and 22 are fused to the semiconductor device structure. The semiconductor structure includes a bulk material 14 covered by a diffused surface layer 17 of opposite semiconductivity. In the final device, the bulk material 14 serves as the second base region 14 and the diffused layer 17, after separation by the groove 34 shown in FIG. 1 which may be of annular configuration surrounding the emitter 10, provides the first base region 12 and the anode 16. There are positioned on the semiconductor structure alloy foil members 42 and 43 for forming the ohmic anode and gate contacts 22 and 23, respectively, and also alloy foil members 41 and 40 which, when fused, form the emitter 10 and the emitter contact 21. The emitter foil 41 is substantially an annular disk and the member 40 is a small dot which results in increased penetration to form the firing pin portion 30. By controlling the thickness of the original alloy foils, the penetration at that point can be controlled adequately within the desired limits. A single alloy foil member could be formed to serve the purposes of members 40 and 41, since they are of the same composition, but it is preferable to use separate members which can be more readily obtained.

The increased depth of penetration of the firing pin portion 30 effectively increases the alpha of the first three regions of the device. Since the breakover voltage is a function of the alphas of the first three regions and the last three regions, it can now be effectively controlled by the depth to which the firing pin portion 30 penetrates. The depth of penetration is in turn controllable, as is well known in the art, by the thickness of the foil members 40 and 41 and the time and temperature of the fusion operation. When the device breaks over, the firing pin portion of the emitter will be the only initially conductive portion. The current passing through the firing pin portion then serves to adjust the alpha of the remaining structure and to cause the entire emitter to become conductive.

While in FIG. 1, the firing pin 30 is on the side of the emitter remote from the gate 23, it is to be understood that advantageous control of the breakover characteristic can be achieved with the firing pin in any position. In some cases it may be preferable to have the firing pin near the gate so that breakover will not be as likely to be caused by leakage current across the emitter-base junction.

Figure 3:
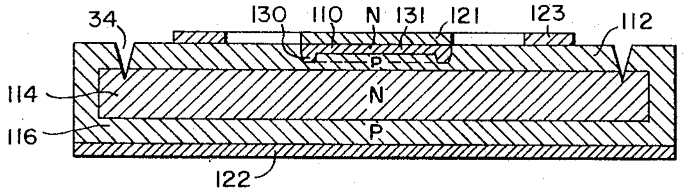
FIG. 3 is a cross sectional view of a semiconductor controlled rectifier in accordance with an alternative embodiment of the present invention.

Referring to FIG. 3, another embodiment is shown including emitter 110, first base 112, second base 114 and anode 116 with emitter contact 121, anode contact 122 and gate contact 123. In this embodiment, the emitter 110 is a circle with a firing pin portion 130 extending around its periphery and penetrating to a greater depth than the major portion 131 of the emitter 110. A possible advantage in employing a ring type firing pin as shown in FIG. 3 is that excellent turn off characteristics should be achieved. By the turn off characteristics of the device is meant the facility by which the device may be switched to the off condition from the on condition by the application of a signal to the gate contact. It is desirable that this be done with a relatively small signal on the gate. By reason of the close spacing between the firing pin 130 and the junction between the first base 112 and the second base 114, and the close spacing between the firing pin portion 130 and the gate contact 123 which encircles it, good turn off characteristics are possible.

The device of FIG. 1 may be fabricated by the following method, given as an example. An N-type silicon single crystal having an impurity concentration equivalent to about 1 to 35 ohm-centimeters resistivity, may be used as a starting wafer. A wafer size of about 450 mils diameter and 8.5 mils thickness is suitable. A P-type impurity, such as gallium, is diffused into the crystal to produce a P-type surface area of about 2 mils in thickness with a surface concentration of about $10^{18}$ atoms per cubic centimeter. The diffustion may be carried out in an inert gas or vacuum at a temperature of from about 1300° C. to about 1100° C. for from about 10 hours to 100 hours to achieve saturation of the surface concentration and the desired depth of diffustion.

Alloy foil members 40 and 42, such as an N-type gold alloy including about 0.5% by weight of antimony, are applied to the surface of the first base region 12 in the position desired for the cathode-emitter including the additional member 40 which produces the firing pin portion 30. As an example, the alloy foil mombers 40 and 41 for the emitter and the firing pin portion thereof may each have a thickness of about 0.001 inch. The annular member 41 may have an inner diameter of about 0.100 and an outer diameter of about 0.350 and the member 40, for the firing pin portion, may have a diameter or maximum lateral dimension of about 0.050.

Suitable alloy foil members 42 and 43, such as an aluminum foil, or a gold alloy foil including about 0.5% by weight of boron, may be disposed in the position desired for the gate contact 23 and for the anode contact 22. Upon fusion of the device at a temperature of about 700° C. for a time of about 10 minutes and then cooling to room temperature, the N-type gold alloy forms a regrown semiconductive region 10 with a metal contact 21 thereon while the P-type gold alloy forms ohmic contacts 22 and 23 with the semiconductive material. The structure is completed by the bonding of leads and encapsulating in a conventional manner.

Other fabrication techniques may of course be employed. For example, if it is desired to form a cathode-emitter region by diffusion, it would be possible to selectively diffuse a portion for the firing pin portion to a greater depth of penetration. Also, epitaxial techniques may be employed to form at least part of the device structure.

As an example, the device of FIG. 1 was described in a semiconductive body of silicon. In addition to silicon, however, other semiconductive material such as germanium or a semiconducting compound are suitable. For example, a compound of elements from Group III of the Periodic Table and elements from Group V of the Periodic Table may be used. Examples of such III–V compounds include gallium arsenide, gallium antimonide, gallium phosphide, indium arsenide, and indium antimonide. A compound of two elements in Group IV of the Periodic Table such as silicon carbide or a compound of an element of Group II of the Periodic Table and an element of Group VI of the Periodic Table such as cadmium sulfide are also examples of suitable materials.

In describing the invention, devices are shown in which a particular type of semiconductivity is ascribed to each semiconductive region. However, the semiconductivity type of the various regions may be reversed from that shown.

It is also to be understood that four region devices including as a fourth region a mass of metal such as those described in copending application S.N. 649,038, filed March 28, 1957, by J. Philips, now Patent 3,141,119, and assigned to the same assignee of the present invention are suitable for use in accordance with this invention. The necessary quality of the fourth or anode region is that it be capable of injecting minority carriers into the adjacent second base region.

Since the present invention achieves a controlled breakover voltage for the device it can be seen that it has application to two terminal devices as well as to devices which include a greater number of terminals than three.

An additional possible modification is that the firing pin need not be associated with the cathode-emitter but it may also be associated with the anode-emitter or a firing pin may be associated with each of the emitters since control of the breakover characteristic can be achieved either way.

It is also the case that the firing pin portion need not be an integral part of the emitter but it may, for example, be a fused alloy foil member spaced from the major portion of the emitter and conductively connected therewith.

While the present invention has been shown and described in certain forms only, it will be obvious to those skilled in the art that it is not so limited but is susceptible of various changes and modifications without departing from the spirit and scope thereof.

What is claimed is:

1. A semiconductor switching device comprising: three successive semiconductive regions of alternate semiconductivity type forming P-N junctions therebetween; a fourth region joined to the third of said successive regions capable of injecting minority carriers into said third region; the first of said successive regions serving as an emitter of said device and having a firing pin portion penetrating into the second of said successive regions a greater distance than the major portion of said emitter so that the breakover characteristic of said device is determined by the depth of penetration of said firing pin portion; said emitter having greater thickness in said firing pin portion than in said major portion and disposed so said emitter and said second region have coplanar surfaces.

2. A semiconductor switching device in accordance with claim 1 wherein:

contacts are disposed on at least said emitter and said fourth region.

3. A semiconductor switching device in accordance with claim 2 wherein:

a contact is also disposed on said second region and said firing pin portion is disposed at the periphery of said emitter remote from said second region contact.

4. A semiconductor switching device in accordance with claim 2 wherein:

a contact is also disposed on said second region and said firing pin portion is disposed at the periphery of said emitter nearest to said second region contact.

5. A semiconductor switching device in accordance with claim 4 wherein:

said firing pin portion is a peripheral ring.

6. A semiconductor controlled rectifier comprising: three successive semiconductive regions of alternate semiconductivity type forming P-N junctions therebetween; a fourth region joined to the third of said successive regions capable of injecting minority carriers into said third region; the first of said successive regions serving as the emitter of said controlled rectifier and having a firing pin portion penetrating into the second of said successive regions to a distance from the P-N junction between said second and third regions which is less than that of the major portion of said first region so that the breakover characteristic of said controlled rectifier is determined by the depth of penetration of said firing pin portion; said second region being a diffused region having a saturated surface concentration of conductivity imparting impurity.

7. A four layer semiconductor switching device comprising: four successive semiconductive regions of alternate semiconductivity type forming P-N junctions therebetween, said regions serving as the cathode-emitter, first base, second base and anode-emitter regions, respectively, said first base region and said anode-emitter being diffused regions and said cathode-emitter being an alloyed region; said cathode-emitter having a major portion and a firing pin portion integral therewith, said firing pin portion penetrating within said first base region to a position closer to the P-N junction between said first base region and said second base region than any point on the major portion of said cathode-emitter so as to readily control the breakover characteristic of the device; said cathode-emitter having greater thickness in said firing pin portion than in said major portion and disposed so said cathode-emitter and said first base region have coplanar surfaces; said first base region having a saturated surface concentration.

References Cited by the Examiner

UNITED STATES PATENTS

| | | | |
|---|---|---|---|
| 2,937,960 | 5/1960 | Pankove | 148—1.5 |
| 2,959,504 | 11/1960 | Ross et al. | 312—235 |
| 2,980,560 | 4/1961 | Weiser | 148—1.5 |
| 2,981,877 | 4/1961 | Noyce | 312—235 |
| 3,188,490 | 6/1965 | Hoff et al. | 307—88.5 |

FOREIGN PATENTS

| | | |
|---|---|---|
| 753,133 | 7/1956 | Great Britain. |

DAVID J. GALVIN, *Primary Examiner.*